(12) United States Patent
Lee et al.

(10) Patent No.: US 10,497,812 B2
(45) Date of Patent: Dec. 3, 2019

(54) TRANSISTOR ARRAY PANEL

(71) Applicant: SAMSUNG DISPLAY CO., LTD., Yongin-Si, Gyeonggi-Do (KR)

(72) Inventors: Dong Hee Lee, Hwaseong-Si (KR); Gwang Min Cha, Hwaseong-Si (KR); Dong Min Lee, Anyang-Si (KR)

(73) Assignee: SAMSUMG DISPLAY CO., LTD., Yongin-Si, Gyeonggi-Do (KR)

( * ) Notice: Subject to any disclaimer, the term of this patent is extended or adjusted under 35 U.S.C. 154(b) by 64 days.

(21) Appl. No.: 15/436,011

(22) Filed: Feb. 17, 2017

(65) Prior Publication Data
US 2017/0358688 A1 Dec. 14, 2017

(30) Foreign Application Priority Data
Jun. 13, 2016 (KR) .................. 10-2016-0073049

(51) Int. Cl.
*H01L 23/48* (2006.01)
*H01L 29/786* (2006.01)
(Continued)

(52) U.S. Cl.
CPC ...... *H01L 29/78633* (2013.01); *H01L 27/124* (2013.01); *H01L 27/1218* (2013.01); *H01L 27/1244* (2013.01); *H01L 29/4908* (2013.01); *H01L 29/7869* (2013.01); *H01L 29/78603* (2013.01); *H01L 29/78618* (2013.01);
(Continued)

(58) Field of Classification Search
CPC ............. H01L 27/1218; H01L 27/1244; H01L 27/124; H01L 27/3262; H01L 27/3272; H01L 27/3276; H01L 27/3248; H01L 29/78633; H01L 29/78648; H01L 29/4908; H01L 29/78618; H01L 29/78603; H01L 29/7869; H01L 29/78666–29/78675; H01L 29/78678; H01L 29/78669
See application file for complete search history.

(56) References Cited

U.S. PATENT DOCUMENTS

2003/0205970 A1* 11/2003 Park ................ H01L 27/3246
313/506
2007/0231974 A1 10/2007 Chiu et al.
(Continued)

FOREIGN PATENT DOCUMENTS

JP 59-047751 3/1984
KR 1020050051458 6/2005
(Continued)

OTHER PUBLICATIONS

European Search Report dated Oct. 16, 2017 in corresponding European Application No. 17170572.6 (9 pages).

*Primary Examiner* — Hoa B Trinh
(74) *Attorney, Agent, or Firm* — F. Chau & Associates, LLC

(57) ABSTRACT

A transistor is positioned on a substrate. The transistor includes a semiconductor layer. A buffer layer is positioned between the substrate and the semiconductor layer of the transistor, including an insulating material. A bottom layer is positioned between the substrate and the buffer layer. The bottom layer and the semiconductor layer overlap each other. The bottom layer includes a first layer, a second layer, and a third layer that are stacked on each other in a direction away from the substrate.

27 Claims, 11 Drawing Sheets

(51) Int. Cl.
   *H01L 27/12*   (2006.01)
   *H01L 29/49*   (2006.01)
   G02F 1/1362    (2006.01)
   G02F 1/1368    (2006.01)
   H01L 27/32     (2006.01)

(52) U.S. Cl.
   CPC ...... *H01L 29/78648* (2013.01); *G02F 1/1368* (2013.01); *G02F 1/136209* (2013.01); *G02F 1/136227* (2013.01); *G02F 1/136286* (2013.01); *G02F 2001/13685* (2013.01); *H01L 27/3248* (2013.01); *H01L 27/3262* (2013.01); *H01L 27/3272* (2013.01); *H01L 27/3276* (2013.01)

(56) References Cited

U.S. PATENT DOCUMENTS

| | | | |
|---|---|---|---|
| 2008/0023665 A1* | 1/2008 | Weiser | H01L 23/3733 252/71 |
| 2009/0202386 A1* | 8/2009 | Yi | C22C 14/00 420/423 |
| 2010/0182223 A1 | 7/2010 | Choi et al. | |
| 2011/0148937 A1 | 6/2011 | Park et al. | |
| 2014/0167040 A1 | 6/2014 | Lee et al. | |
| 2015/0155363 A1 | 6/2015 | Nakazawa et al. | |

FOREIGN PATENT DOCUMENTS

| | | |
|---|---|---|
| KR | 1020130058511 | 6/2013 |
| KR | 1020140055911 | 5/2014 |
| KR | 1020140066524 | 6/2014 |

\* cited by examiner

TRANSISTOR ARRAY PANEL

CROSS-REFERENCE TO RELATED APPLICATION

This application claims priority under 35 U.S.C. 119 to Korean Patent Application No. 10-2016-0073049 filed on Jun. 13, 2016, in the Korean Intellectual Property Office, the disclosure of which is incorporated by reference herein in its entirety.

TECHNICAL FIELD

The present invention relates to a transistor array panel.

DESCRIPTION OF RELATED ART

Transistor array panels include a plurality of transistors positioned on a substrate. Those transistors operate to transmit a data signal and a driving voltage for a pixel.

SUMMARY

According to an exemplary embodiment, a transistor array panel is provided as follows. A transistor is positioned on a substrate. The transistor includes a semiconductor layer. A buffer layer is positioned between the substrate and the semiconductor layer of the transistor, including an insulating material. A bottom layer is positioned between the substrate and the buffer layer. The bottom layer and the semiconductor layer overlap each other. The bottom layer includes a first layer, a second layer, and a third layer that are stacked on each other in a direction away from the substrate.

According to an exemplary embodiment of the present inventive concept, a transistor array panel is provided as follows. A transistor is positioned on a substrate, including a semiconductor layer. A buffer layer is positioned between the substrate and the transistor, including an insulating material. A bottom layer is positioned between the substrate and the buffer layer, overlapping the semiconductor layer. The bottom layer includes a first layer including a metal and a second layer including an metal alloy including copper, nickel and zinc.

According to an exemplary embodiment of the present invention, a transistor array panel is provided as follows. A substrate includes a first region and a second region. A bottom layer is positioned on the first region of the substrate. The bottom layer includes a metal layer formed of a first metal and a metal alloy layer including the first metal. A driving transistor is positioned on the substrate, the driving transistor overlapping the bottom layer. A switching transistor is positioned on the second region of the substrate. A pixel electrode is electrically connected to a second source/drain region of the driving transistor. A gate line is connected to a switching gate electrode of the switching transistor. A gate electrode of the driving transistor is electrically connected to a second switching source/drain region of the switching transistor. The gate line is positioned lower than the gate electrode of the driving transistor. The bottom layer is electrically connected to the second source/drain region of the driving transistor and the pixel electrode.

BRIEF DESCRIPTION OF DRAWINGS

These and other features of the present invention will become more apparent by describing in detail exemplary embodiments thereof with reference to the accompanying drawings of which.

DETAILED DESCRIPTION OF EXEMPLARY EMBODIMENTS

Figure 1:
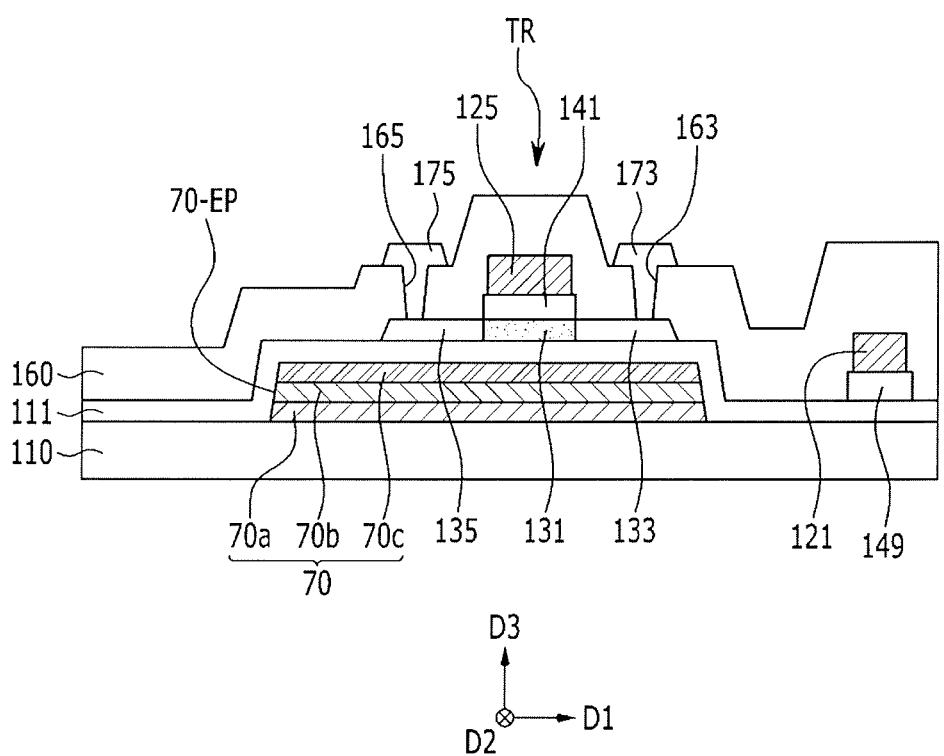
FIG. 1, FIG. 2, FIG. 3, and FIG. 4 are cross-sectional views of a transistor array panel according to an exemplary embodiment of the present invention.

Exemplary embodiments of the present invention will be described below in detail with reference to the accompanying drawings. However, the present invention may be embodied in different forms and should not be construed as limited to the embodiments set forth herein. In the drawings, the thickness of layers and regions may be exaggerated for clarity. It will also be understood that when an element is referred to as being "on" another element or substrate, it may be directly on the other element or substrate, or intervening layers may also be present. It will also be understood that when an element is referred to as being "coupled to" or "connected to" another element, it may be directly coupled to or connected to the other element, or intervening elements may also be present. Like reference numerals may refer to the like elements throughout the specification and drawings.

The transistor array panel according to an exemplary embodiment of the present invention will be described with reference to FIG. 1 and FIG. 2.

Figure 2:
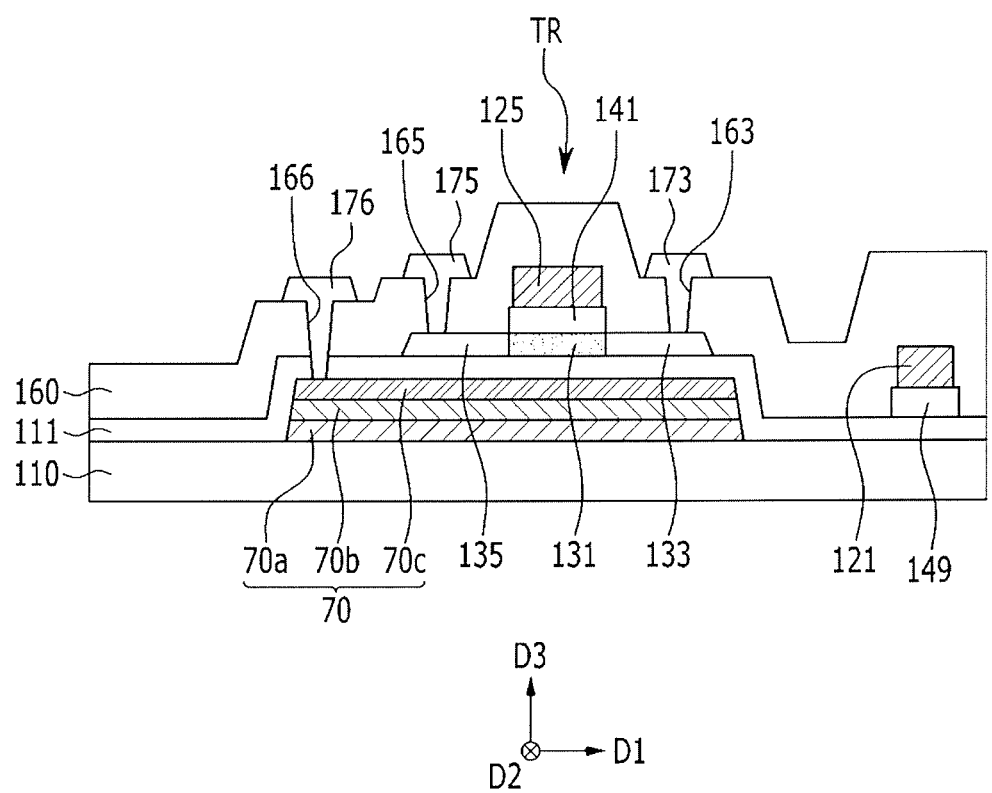

Referring to FIG. 1 and FIG. 2, the transistor array panel according to an exemplary embodiment of the present invention includes a substrate 110 and a plurality of transistors TR positioned on one surface of the substrate 110.

A first direction D1 and a second direction D2 shown in FIG. 1 and FIG. 2 are parallel to a surface of the substrate 110 and are perpendicular to each other, and a third direction D3 is perpendicular to the first and second directions D1 and D2 and is substantially perpendicular to the surface of the substrate 110. For example, the substrate 110 has a surface parallel to a direction crossing the third direction D3. The cross-sectional structures of FIGS. 1 and 2 show a structure taken in parallel to the third direction D3, which may be referred to as a cross-sectional direction. A structure shown when viewed in the third direction D3 is referred to as a plane structure. In the cross-sectional structure, if a constituent element is positioned on any other constituent element, it means that two constituent elements are arranged in the third direction D3, and other constituent elements may be positioned between the two constituent elements.

The substrate 110 includes an insulating material such as plastic, glass, etc.

The transistor TR includes an upper electrode 125, a semiconductor layer 131, a first electrode 133, a second electrode 135, and a first gate insulator 141.

Hereinafter, the upper electrode 125 may be referred to as a gate electrode; the first electrode may be referred to as a first source/drain region; and the second electrode may be referred to as a second source/drain region.

The upper electrode 125 may be connected to a gate line (not shown), and may be applied with a gate signal including a gate-on voltage Von and a gate-off voltage Voff. In this case, the upper electrode 125 functions as a gate electrode of the transistor TR.

The upper electrode 125 and the gate line may be positioned on a same layer as the gate line on the cross-section, and may include a same material. The present invention is not limited thereto.

The first gate insulator 141 is positioned between the semiconductor layer 131 and the upper electrode 125. The first gate insulator 141 may be a single layer. The present invention is not limited thereto. For example, the first gate insulator 141 may be formed of two or more layers. The first gate insulator 141 may include silicon oxide ($SiO_x$), silicon nitride ($SiN_x$), silicon oxynitride (SiON), aluminum oxide ($Al_2O_3$), hafnium oxide ($HfO_3$), or yttrium oxide ($Y_2O_3$).

The first gate insulator 141 may be only positioned between the semiconductor 131 and the upper electrode 125. In this case, an edge of an upper surface or a lower surface of the first gate insulator 141 is substantially parallel to the edge of the upper surface or the lower surface of the upper electrode 125. That two edges are substantially parallel to each other means that two edges are aligned each other in the third direction D3 or are parallel to each other and mismatched at a predetermined distance. For example, when viewed along the third direction D3, a plane shape of the first gate insulator 141 and a plane shape of the upper electrode 125 may be substantially the same, if the two edges are aligned each other.

Referring to FIG. 1 and FIG. 2, the edge of the upper surface and the lower surface of the first gate insulator 141 is positioned at a predetermined distance outwardly from the edge of the lower surface of the upper electrode 125. As described above, the edge of the upper surface and the lower surface of the first gate insulator 141 may be parallel to the edge of the lower surface of the upper electrode 125. This may be a result of the upper electrode 125 and the first gate insulator 141 being formed by using one photomask in the manufacturing process of the transistor array panel. For example, the upper electrode 125 and the first gate insulator 141 may be patterned together using a same photomask.

The present invention is not limited thereto. For example, the first gate insulator 141 may be continuously formed on the substrate 110 beyond the edge of the upper electrode 125. In this case, the first gate insulator 141 may be positioned on the first electrode 133 and the second electrode 135 of the transistor TR.

The semiconductor layer 131 overlaps the upper electrode 125 via the first gate insulator 141 interposed therebetween. When the transistor TR is operated, a channel of the transistor TR is formed in the semiconductor layer 131.

The first electrode 133 and the second electrode 135 are positioned at respective sides based on the semiconductor 131. The first electrode 133 and the second electrode 135 may be directly connected to the semiconductor 131.

The first electrode 133, the second electrode 135, and the semiconductor 131 may include a same material. For example, the semiconductor 131, the first electrode 133, and the second electrode 135 may include zinc oxide (ZnO), zinc-tin oxide (ZTO), zinc-indium oxide (ZIO), indium oxide (InO), titanium oxide (TiO), indium-gallium-zinc oxide (IGZO), or indium-zinc-tin oxide (IZTO).

The first electrode 133 and the second electrode 135 are conductive, and a carrier concentration of the first electrode 133 and the second electrode 135 is higher than a carrier concentration of the semiconductor layer 131. A gradient region may exist where the carrier concentration is gradually changed in the boundary between the first electrode 133 and the semiconductor 131 and the boundary between the second electrode 135 and the semiconductor 131.

When the semiconductor layer 131 includes an oxide semiconductor layer, the first electrode 133 and the second electrode 135 may be formed by making the oxide semiconductor layer forming the semiconductor 131 conductive by a method such as a plasma processing. For example, the oxide semiconductor layer is doped with a gas including at least one among fluorine (F), hydrogen (H), and sulfur (S) in a chamber to form the first electrode 133 and the second electrode 135 so that the first electrode 133 and the second electrode 135 are conductive.

According to an exemplary embodiment of the present invention, the edge of the semiconductor 131, particularly the edge of the upper surface, may be substantially parallel to the edge of the first gate insulator 141, particularly the edge of the lower surface of the first gate insulator 141. For example, the boundary between the semiconductor 131 and the first electrode 133 or the boundary between the semiconductor 131 and the second electrode 135 may be substantially matched with the edge of the first gate insulator 141, particularly the edge of the lower surface of the first gate insulator 141, or may be positioned more outward or inward than the edge of the first gate insulator 141 and may be substantially parallel to the edge of the first gate insulator 141. For example, when viewed along the third direction of D3, the plane shape of the semiconductor 131 may be substantially the same as the plane shape of the first gate insulator 141.

The first gate insulator 141 may cover the semiconductor layer 131. For example, the first gate insulator 141 may cover entirely the semiconductor layer 131.

The first electrode 133 and the second electrode 135 may be spaced apart from the upper electrode 125 in the third direction D3. Accordingly, a parasitic capacitance between the upper electrode 125, and the first electrode 133 or the second electrode 135, may be significantly reduced, thereby reducing a kickback voltage, a signal delay, and distortion.

A buffer layer 111 is positioned between the substrate 110 and the transistor TR. The buffer layer 111 prevents an impurity from diffusing from the substrate 110 to the semiconductor 131, thereby protecting the semiconductor 131 and preventing characteristic degradation of the semiconductor 131 due to the impurity.

The buffer layer 111 may include an inorganic insulating material, and may be a single layer. The present invention is not limited thereto. For example, the buffer layer 11 may include two or more layers.

The buffer layer 111 may be free of hydrogen (H) or may barely include hydrogen to prevent hydrogen from diffusing into the transistor TR. For example, if the buffer layer 111 is two or more layers including an upper layer (not shown) adjacent to the semiconductor 131, the upper layer may be free of hydrogen (H), or may include barely hydrogen. If the buffer layer 111 may be a single layer of an insulating material, the buffer layer 111 may be free of hydrogen or may barely include hydrogen.

In an exemplary embodiment, the concentration of hydrogen may controlled to be free or have a predetermined concentration to the extent the transistor TR is not degraded due to the hydrogen.

If the upper layer adjacent to the semiconductor 131 when the buffer layer 111 is the multilayer or the buffer layer 111 of the single layer includes the insulating material that can further include hydrogen at the relatively high concentration due to the deposition conditions, such as a silicon nitride (SiNx), hydrogen penetrates the semiconductor 131 such that the characteristics of the transistor TR may be degraded and the transistor TR may be abnormally operated. Accordingly, the upper layer adjacent to the semiconductor 131 when the buffer layer 111 is the multilayer or the buffer layer 111 of the single layer includes hydrogen at a lower concentration than silicon nitride (SiNx). In an exemplary embodiment, the insulating material of the buffer layer 111 may be free of hydrogen. For example, the upper layer of the buffer layer 111 include silicon oxide (SiOx), aluminum oxide ($Al_2O_3$), hafnium oxide ($HfO_3$), and yttrium oxide ($Y_2O_3$). If the buffer layer 111 is a single layer, the buffer layer 111 may be formed of silicon oxide (SiOx), aluminum oxide ($Al_2O_3$), hafnium oxide ($HfO_3$), and yttrium oxide ($Y_2O_3$).

FIG. 1 and FIG. 2 show that the buffer layer 111 is continuously formed on the substrate 110. The present invention is not limited thereto. For example, the buffer layer 111 may only be positioned in the partial region on the substrate 110. For example, the buffer layer 111 may only be positioned between the first electrode 133 and the substrate 110, between the second electrode 135 and the substrate 110, and between the semiconductor layer 131 and the substrate 110.

A bottom layer 70 is positioned between the transistor TR and the substrate 110. For example, the bottom layer 70 is positioned between the buffer layer 111 and the substrate 110.

The bottom layer 70 overlaps the semiconductor 131 in the third direction D3 such that the semiconductor 131 may be covered by the bottom layer 70 when viewed from the lower surface direction of the substrate 110. The bottom layer 70 may also overlap the first electrode 133 and the second electrode 135.

The bottom layer 70 includes at least two layers that are deposited in the third direction D3 when viewed in the cross-sectional structure. In FIG. 1 and FIG. 2, the bottom layer 70 includes a first layer 70a, a second layer 70b, and a third layer 70c. The present invention is not limited thereto. For example, the first layer 70a may be omitted.

The first layer 70a as a lowest layer of the bottom layer 70 is in contact with another layer positioned under the bottom layer 70. For example, the first layer 70a of the bottom layer 70 is in contact with the substrate 110. The first layer 70a may have a function of reinforcing adhesion of the bottom layer 70 with the substrate 110.

When the adhesion of the second layer 70b with the substrate 110 is an acceptable level by considering design conditions of the transistor array panel, the first layer 70a may be omitted.

The second layer 70b is positioned between the first layer 70a and the third layer 70c and may include a metal such as copper (Cu). The metal included in the second layer 70b may have a low resistance. In an exemplary embodiment, an edge profile of the second layer 70b may be controlled so that an edge profile 70-EP of the bottom layer 70 does not cause defects in a layer deposited on the bottom layer 70. In an exemplary embodiment, the metal may include copper. Hereinafter, the second layer 70b may be referred to as a metal layer.

When omitting the first layer 70a, the second layer 70b may be in contact with a layer disposed under the bottom layer 70, for example, the substrate 110.

The third layer 70c as a highest layer of the bottom layer 70 is in contact with a layer disposed on the bottom layer 70. For example, the third layer 70c of the bottom layer 70 is in contact with the buffer layer 111. The third layer 70c may have a function of preventing the second layer 70b from being oxidized or corroded by oxygen diffused from the layer positioned on the bottom layer 70 of the buffer layer 111.

For example, if the second layer 70b includes copper (Cu) and the third layer 70c is omitted, and if the buffer layer 111 includes an oxide such as silicon oxide (SiOx), copper included in the second layer 70b may react with oxygen of the buffer layer 111. Such oxidation reaction may occur in the deposition process of the buffer layer 111 to form copper oxide (CuOx) at an interface between the bottom layer 70 and the buffer layer 111. Thus, the resistance of the bottom layer 70 may increase compared with when the bottom layer 70 is not oxidized. Since the copper oxide may be brittle, a crack may be generated in the buffer layer 111 deposited on the bottom layer 70. The crack may cause a defect of the transistor TR formed on the bottom layer 70.

In an exemplary embodiment, the third layer 70c of the bottom layer 70 may serve to protect the second layer 70b from the influence of the buffer layer 111 including the oxide such as silicon oxide (SiOx). Accordingly, the second layer 70b of the bottom layer 70 is prevented from being oxidized or corroded by the buffer layer 111 such that the resistance of the bottom layer 70 including the second layer 70b is prevented from being increased and the generation of the defect of the layers disposed on the bottom layer 70 and the defect in the transistor TR may be prevented.

In an exemplary embodiment, at least one of the first layer 70a and the third layer 70c of the bottom layer 70 may include a copper-nickel-zinc alloy (CNZ). Hereinafter, the at least one of the first layer 70a and the third layer 70c, if including the copper-nickel-zinc alloy, may be referred to as a metal alloy layer. For example, at least one of the first layer 70a and the third layer 70c may include a metal alloy including copper, nickel or zinc. A ratio of copper:zinc:nickel in the copper-nickel-zinc alloy included in the first layer 70a and/or the third layer 70c may be 4:4:2 in an atomic weight percent (at. %). For example, the metal alloy may include about 40 at. % of copper, about 40 at. % of nickel and about 20 at. % of zinc.

If at least one of the first layer 70a and the third layer 70c includes the copper-nickel-zinc alloy, oxidation resistance, adhesiveness, and moisture permeability resistance of the first layer 70a and/or the third layer 70c may increase compared with the case of using the other materials.

For example, if the first layer 70a and/or the third layer 70c include the copper-nickel-zinc alloy, the adhesiveness of the bottom layer 70 with another layer is increased such that the bottom layer 70 may be prevented from being lifted.

If the first layer 70a and/or the third layer 70c include the copper-nickel-zinc alloy, the defect being generated in the second layer 70b by the influence of the component of another layer adjacent to the bottom layer 70, for example, the buffer layer 111 may be prevented. For example, the oxidization and the corrosion of the second layer 70b are prevented by the oxidization resistance and the moisture penetration resistance of the first layer 70a and/or the third layer 70c such that the resistance increase of the bottom layer 70 including the second layer 70b may be prevented and the crack may be prevented from occurring in the buffer layer 111 deposited on the bottom layer 70 and the overlying layers.

It is experimentally confirmed that a difference of resistivity (about 2.1 μΩ·cm according to an experimental example) of the layer only including copper and the resistivity of two layers (about 2.244 μΩ·cm according to an experimental example) including the layer made of copper and the layer made of the copper-nickel-zinc alloy is not large. Accordingly, compared with the bottom layer including only copper, it may be confirmed that the resistance of the bottom layer 70 according to the present exemplary embodiment including the first layer 70a and/or the third layer 70c made of the copper-nickel-zinc alloy is not high. For example, the bottom layer 70 according to the present exemplary embodiment may maintain the low resistance as much as the case of only using copper.

If the second layer 70b includes copper, the first layer 70a, the second layer 70b, and the third layer 70c may be etched by an etchant for copper etching to form the bottom layer 70. For example, the second layer 70b, the first layer 70a and the second layer 70b may be etched together using the same etchant for copper etching. An etch rate of the etchant for the first layer 70a, the second layer 70b, and the third layer 70c may be similar such that the patterned bottom layer 70 may have the edge profile 70-ES having a slope to the extent that an undercut or a protrusion of the edge profile 70-Es of the bottom layer 70 may be prevented. Accordingly, the possibility of the defect such as the crack being generated in a layer deposited on the bottom layer 70 may be reduced, and the characteristic degradation of the transistor TR positioned on the bottom layer 70 may be prevented.

In an exemplary embodiment, the first layer 70a among of the first layer 70a, the second layer 70b, and the third layer 70c of the bottom layer 70 only includes the copper-nickel-zinc alloy, and the third layer 70c may include a transparent conductive oxide such as indium zinc oxide (IZO), aluminum zinc oxide (AZO), gallium doped zinc oxide (GZO), or indium tin oxide (ITO).

If the first layer 70a which is in contact with the substrate 110 includes the copper-nickel-zinc alloy, the damage of the substrate 110 may be suppressed compared with the case where the first layer 70a may include a different metal from the copper-nickel-zinc alloy, in the patterning process of the bottom layer 70 among the manufacturing process of the transistor array panel.

In an exemplary embodiment, if the defect is generated in the patterning of the bottom layer 70, the substrate 110 may be reused to increase the manufacturing yield of the transistor array panel.

In an exemplary embodiment, the third layer 70c among the first layer 70a, the second layer 70b, and the third layer 70c of the bottom layer 70 only includes the copper-nickel-zinc alloy. In this case, the first layer 70a may include a metal such as titanium (Ti), molybdenum (Mo), aluminum (Al), or alloys thereof.

In an exemplary embodiment, the bottom layer 70 may serve a light blocking function for the semiconductor 131. The bottom layer 70 blocks the external light from reaching the semiconductor 131 such that the characteristic deterioration of the semiconductor layer 131 may be prevented and the leakage current of the transistor TR may be suppressed.

In this case, the bottom layer 70 may prevent light of a wavelength band to be blocked from penetrating the bottom layer 70.

In an exemplary embodiment, the bottom layer 70 may serve to obtain a uniform output current characteristic in a saturation region of the transistor TR if the bottom layer 70 is electrically connected to one electrode of the transistor TR to be applied with the voltage. This will be described later in detail in a corresponding description.

An interlayer insulating layer 160 is positioned on the transistor TR. The interlayer insulating layer 160 may be a single layer. The present invention is not limited thereto. For example, the interlayer insulating layer 160 may be formed of two or more layers. When the interlayer insulating layer 160 is the single layer, the inorganic insulating material such as silicon oxide (SiOx), silicon nitride (SiNx), silicon oxynitride (SiON), and silicon oxyfluoride (SiOF). For example, the interlayer insulating layer 160 may include silicon nitride (SiNx) or silicon oxynitride (SiON) that may inflow hydrogen (H) to the first electrode 133 and the second electrode 135 to reduce the resistance of the first electrode 133 and the second electrode 135.

For example, if the interlayer insulating layer 160 is formed of two or more layers, a lowest layer of the interlayer insulating layer 160 include silicon nitride (SiNx) or silicon oxynitride (SiON) that may inflow hydrogen (H) to the first electrode 133 and the second electrode 135. The other layers of the interlay insulating layer 160, for example, a middle layer or an upper layer, may include silicon oxide (SiOx). The other layers may be positioned on the lowest layer of the interlayer insulating layer 160.

Another layer including silicon nitride (SiNx) or silicon oxynitride (SiON) may be further positioned on the middle layer including the silicon oxide (SiOx).

The first electrode 133 and the second electrode 135 of the transistor TR may be formed by making a semiconductor material (an oxide semiconductor layer) conductive through a separate plasma processing after depositing the semiconductor material on the substrate 110. Hydrogen included in a gas such as silane (SiH$_4$) and ammonia (NH$_3$) used in a layer formation process of the interlayer insulating layer 160 may be doped into the oxide semiconductor layer, thereby forming the first electrode 133 and the second electrode 135. Also, the component such as hydrogen included in the interlayer insulating layer 160 may be diffused after forming the interlayer insulating layer 160, thereby further reducing the resistance.

The interlayer insulating layer 160 has a first contact hole 163 exposing the first electrode 133 and overlapping the first electrode 133 and a second contact hole 165 exposing the second electrode 135 and overlapping the second electrode 135. The interlayer insulating layer 160 is removed in the first and second contact holes 163 and 165.

A data conductor DC including a first connection part 173 and a second connection part 175 is positioned on the interlayer insulating layer 160. The first connection part 173 is electrically connected to the first electrode 133 of the transistor TR through the first contact hole 163 of the interlayer insulating layer 160, and the second connection part 175 is electrically connected to the second electrode 135 of the transistor TR through the second contact hole 165 of the interlayer insulating layer 160.

Referring to FIG. 2, the interlayer insulating layer 160 and the buffer layer 111 are positioned on the bottom layer 70 and may further include a third contact hole 166 overlapping the bottom layer 70, and the data conductor DC may further include a third connection part 176 electrically connected to the bottom layer 70 through the third contact hole 166. The third connection part 176 may be positioned with the same layer as the first connection part 173 and the second connection part 175 may be. For example, the third connection part 176 may be positioned on the interlayer insulating layer 160.

As shown in FIG. 2, when the bottom layer 70 is applied with a voltage through the third connection part 176, the resistance of the bottom layer 70 need not be increased due to oxidation of the second layer 70b during and after the manufacturing process of the transistor array panel is performed. Accordingly, a voltage drop between the third connection part 176 and the bottom layer 70 may be prevented when a voltage transmitted by another electrode (not shown) is applied to the bottom layer 70 through the third connection part 176.

In an exemplary embodiment, the third layer 70c may prevent the second layer 70b from being oxidized in the process of forming the third contact hole 166.

Referring to FIG. 1 and FIG. 2, the transistor array panel according to an exemplary embodiment of the present invention may include a gate conductor positioned with the same layer as the upper electrode 125 and including the same material. The gate conductor may include a gate line 121. A second gate insulator 149 including the same material as the gate insulator 141 may be positioned under the gate conductor including the gate line 121. The second gate insulator 149 may be positioned on the buffer layer 111. The gate insulator 149 may have substantially the same shape as the overlying gate conductor. For example, the edge of the gate conductor including the gate line 121 may be substantially parallel to the edge of the second gate insulator 149.

For example, FIG. 2 shows a portion of the gate line 121

In an exemplary embodiment, the first gate insulator 141 and the second gate insulator 149 may be connected to each other on the same layer. For example, the first gate insulator 141 may be connected to the second gate insulator 149 on the buffer layer 111.

Although not shown, the interlayer insulating layer 160 may further have a contact hole (not shown) positioned on a part of the gate conductor.

Next, the transistor array panel according to an exemplary embodiment of the present invention will be described with reference to FIG. 3 as well as FIG. 1 and FIG. 2. The same description for the same constituent elements as in the above-described exemplary embodiment is omitted.

Figure 3:
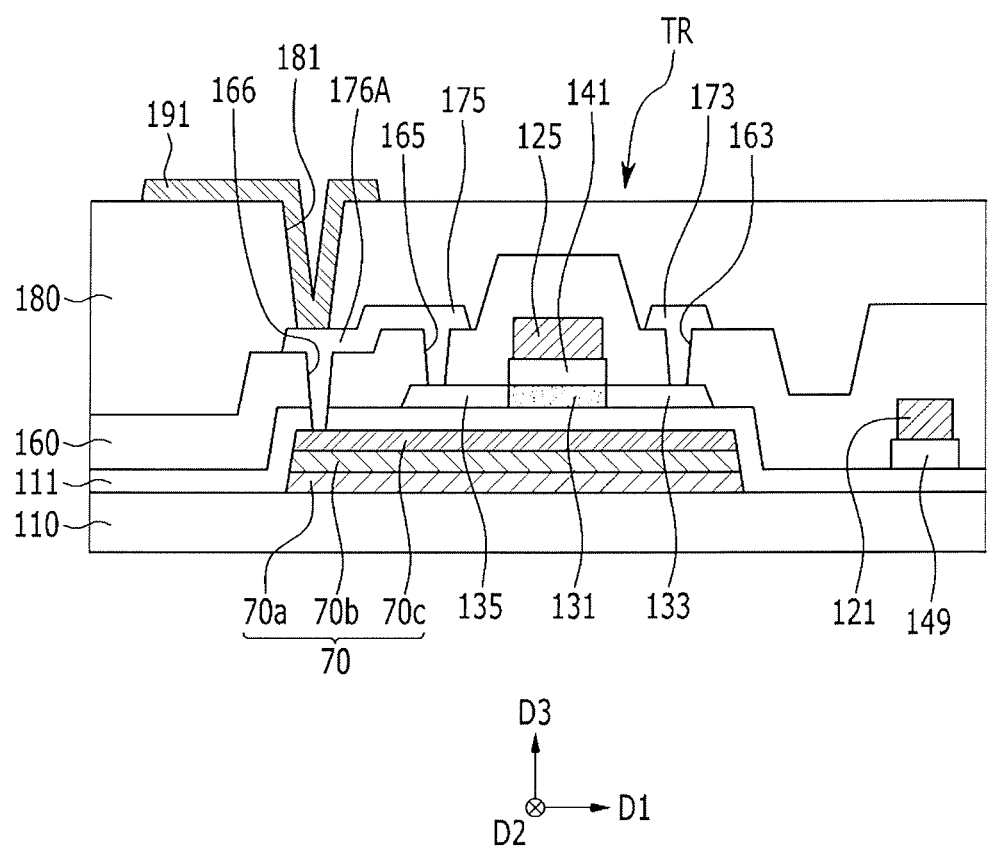

Referring to FIG. 3, a third connection part 176A connected to the bottom layer 70 is substantially the same as the third connection part 176 of the above-described exemplary embodiment, except that the third connection part 176A may be physically and electrically connected to the second connection part 175 connected to the second electrode 135 of the transistor TR. Accordingly, the bottom layer 70 may be applied with the voltage transmitted by the second electrode 135 of the transistor TR through the third connection part 176A.

Referring to FIG. 3, a passivation layer 180 may be positioned on the interlayer insulating layer 160 and the data conductor DC. The passivation layer 180 may include an inorganic insulating material or an organic insulating material, and may be formed of a single layer or a multilayer. The upper surface of the passivation layer 180 may be substantially flat.

The passivation layer 180 has a fourth contact hole 181 exposing the second connection part 175 or the third connection part 176A and overlapping the second connection part 175 or the third connection part 176A. In FIG. 3, the fourth contact hole 181 of the passivation layer 180 is positioned on the third connection part 176A.

A pixel electrode 191 is positioned on the passivation layer 180. The pixel electrode 191 may be positioned in a corresponding pixel. For example, a plurality of pixel electrodes 191 including the pixel electrode 191 may be one by one in a plurality of pixels included in the transistor array panel.

The pixel electrode 191 is in contact with the third connection part 176A through the contact hole 181 to be electrically connected thereto. Accordingly, the pixel electrode 191 is electrically connected to the second electrode 135 of the transistor TR to be applied with a voltage, and the bottom layer 70 is also electrically connected to the pixel electrode 191 and the second electrode 135 through the third connection part 176A to be applied with the voltage.

As described above, if the bottom layer 70 is electrically connected to the second electrode 135 of the transistor TR to be applied with the voltage, a current slope decreases in the saturation region among a voltage-current characteristic graph of the transistor TR such that a range of the region in which the output current of the transistor TR is constant may be widened. Accordingly, even if the change is generated in the voltage input to the first electrode 133 of the transistor TR, the output current of the transistor TR is constant such that the output saturation characteristic may be stabilized. Accordingly, even if the deviation is generated in the voltage input into the first electrode 133 by a voltage drop depending on the position of the transistor array panel, since the output current of the plurality of transistors TR is constantly maintained, a luminance deviation between the pixels depending on the output current of the transistor TR decreases such that the quality of the image may increase.

Next, the transistor array panel according to an exemplary embodiment of the present invention will be described with reference to FIG. 4 and FIG. 5 along with the above-described drawings.

The transistor array panel according to an exemplary embodiment as an organic light emitting panel includes substantially the same constituent elements as the transistor array panel of FIG. 3. The same description for the same constituent elements as in the above-described exemplary embodiment is omitted.

Figure 4:
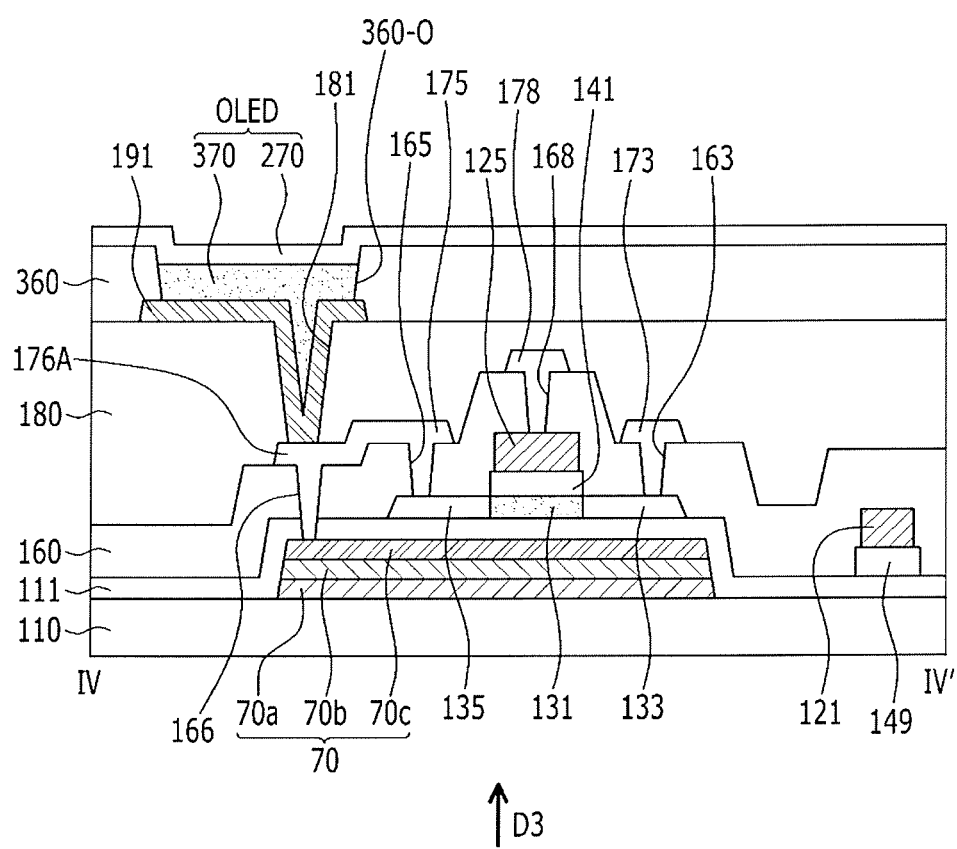

Referring to FIG. 4, a pixel definition layer 360 may be positioned on the pixel electrode 191 and the passivation layer 180. The pixel definition layer 360 includes an opening 360-O positioned on the pixel electrode 191.

In the opening 360-O of the pixel definition layer 360, an emission layer 370 is positioned on the pixel electrode 191 and a common electrode 270 is positioned on the emission layer 370. The pixel electrode 191, the emission layer 370, and the common electrode 270 together form an organic light emitting diode (OLED). The pixel electrode 191 may form an anode of the organic light emitting diode (OLED) and the common electrode 270 may form a cathode of the organic light emitting diode (OLED), or vice versa.

An encapsulation member (not shown) protecting the organic light emitting diode (OLED) may be positioned on the common electrode 270.

Figure 5:
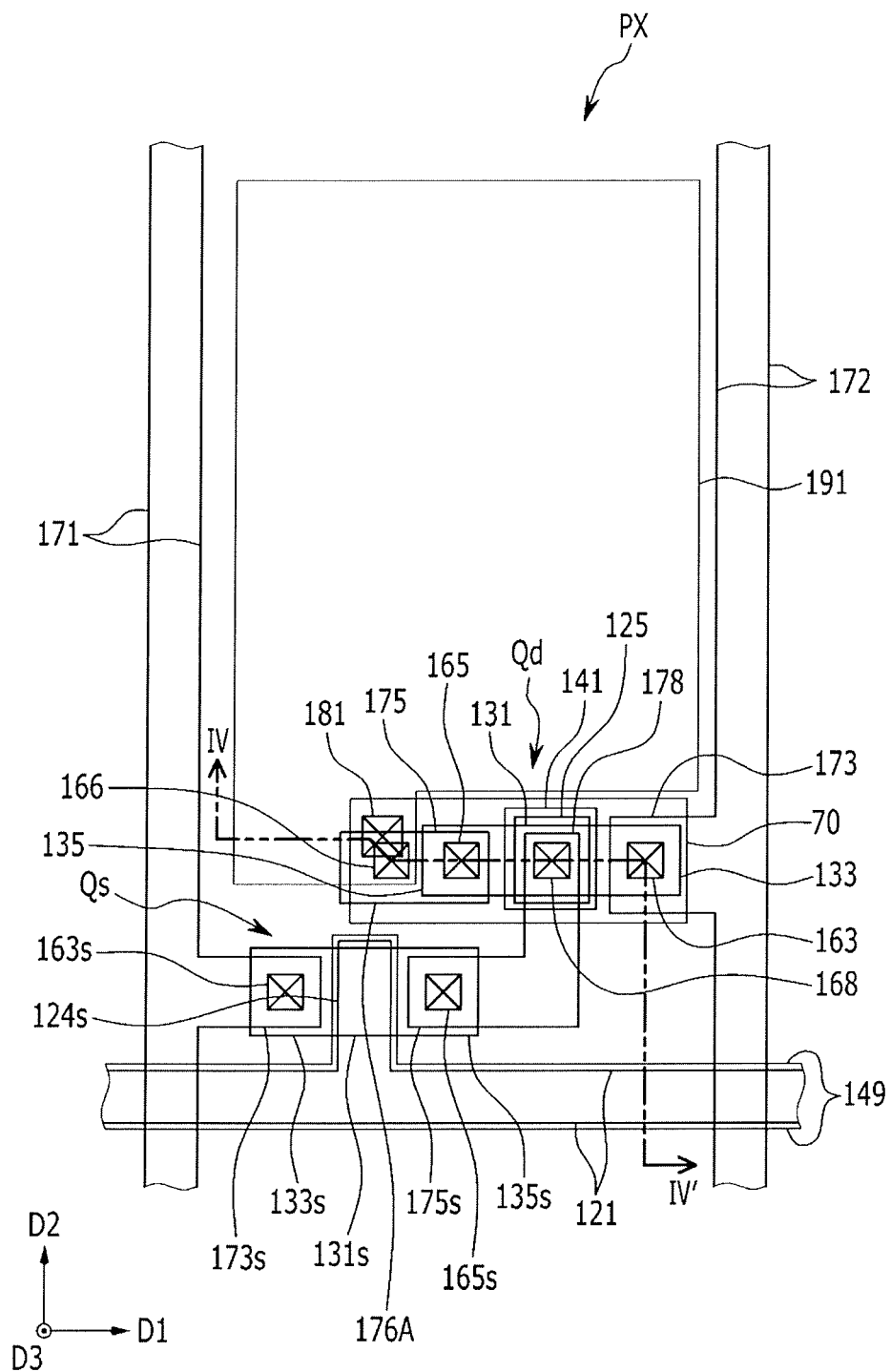
FIG. 5 is a top view of the transistor array panel shown in FIG. 4 according to an exemplary embodiment of the present invention.

FIG. 5 is a top plan view of one pixel PX of a transistor array panel according to an exemplary embodiment of the present invention, and FIG. 4 is a cross-sectional view of the transistor array panel shown in FIG. 5 taken along line IV-IV'. The present invention is not limited thereto. For example, the plane structure of the transistor array panel having the same cross-sectional structure as in FIG. 4 may have different plane structures from the plane structure of FIG. 5.

Referring to FIG. 4 along with FIG. 5, the gate line 121 and the gate insulator 149 may have the same plane shape. The gate line 121 and the gate insulator 149 may mainly extend along a horizontal direction, that is, the first direction D1. The gate line 121 may include a switching gate electrode 124s. The switching gate electrode 124s may be protruded in a different direction from an extending direction of the gate line 121. For example, the switching gate electrode 124 may be protruded in the second direction D2 from the gate line 121.

The transistor array panel according to an exemplary embodiment includes a switching semiconductor layer 131s, a first switching electrode 133s, and a second switching electrode 135s that are positioned with the same layer as the above-described semiconductor layer 131, first electrode 133, and second electrode 135.

Hereinafter, the first switching electrode may be referred to as a first switching source/drain region; and the second switching electrode may be referred to as a second switching source/drain region.

The switching semiconductor layer 131s overlaps the switching gate electrode 124 via the gate insulator (not shown) positioned at the same layer as the above-described first gate insulator 141.

The first switching electrode 133s and the second switching electrode 135s are positioned at respective sides of the switching gate electrode 124 and are separated from each other. The first switching electrode 133s and the second switching electrode 135s may be positioned at the same layer as the switching semiconductor layer 131s and may be connected directly to the switching semiconductor layer 131s.

The switching semiconductor layer 131s, the first switching electrode 133s, and the second switching electrode 135s may include the same material as the semiconductor layer 131, the first electrode 133, and the second electrode 135 of the above-described transistor TR.

The interlayer insulating layer 160 may have a contact hole 163s exposing the first switching electrode 133s and overlapping the first switching electrode 133s, a contact hole 165s exposing the second switching electrode 135s and overlapping the second switching electrode 135s, and a contact hole 168 exposing the upper electrode 125 and overlapping the upper electrode 125.

The data conductor DS positioned on the interlayer insulating layer 160 may further include a data line 171, a driving voltage line 172, a switching drain electrode 175s, and a fourth connection part 178 as well as the above-described first connection part 173, second connection part 175, and third connection part 176A.

The data line 171 and the driving voltage line 172 may mainly extend in a direction crossing the gate line 121, for example, the direction parallel to the second direction D2.

The data line 171 transmits a data voltage and includes a switching source electrode 173s. The switching source electrode 173s may be protruded in a different direction from the extending direction of the data line 171 and may extend toward the switching gate electrode 124s. For example, the switching source electrode 173s may be protruded in the first direction D1 from the data line 171.

The driving voltage line 172 transmits a driving voltage and is connected to the above-described first connection part 173.

The switching drain electrode 175s includes a part facing the switching source electrode 173s. The switching drain electrode 175s and the switching source electrode 173s may be positioned in the opposite sides of the switching gate electrode 124s.

The switching source electrode 173s is in contact with the first switching electrode 133s to be electrically connected through the contact hole 163s of the interlayer insulating layer 160, and the switching drain electrode 175s is connected to the second switching electrode 135s to be electrically connected through the contact hole 165s of the interlayer insulating layer 160.

The fourth connection part 178 is connected to the switching drain electrode 175s. The fourth connection part 178 is in contact with the upper electrode 125 to be electrically connected through the contact hole 168 of the interlayer insulating layer 160. Accordingly, the switching drain electrode 175s is electrically connected to the upper electrode 125.

The switching gate electrode 124s, the first switching electrode 133s, and the second switching electrode 135s form a switching transistor Qs along with the switching semiconductor 131s, and the upper electrode 125, the first electrode 133, and the second electrode 135 form a driving transistor Qd along with the semiconductor 131. The structures of the switching transistor Qs and the driving transistor Qd are not limited thereto and may be variously changed.

Referring to FIG. 5, the bottom layer 70 overlaps the semiconductor layer 131 of the driving transistor Qd and may also overlap the first electrode 133 and the second electrode 135. The bottom layer 70 may have an island shape to be limited in the region of one pixel PX.

If the switching transistor Qs is turned on depending on the gate signal transmitted by the gate line 121, the voltage transmitted by the data line 171 is transmitted to the upper electrode 125 of the driving transistor Qd. The driving transistor Qd flows the output current depending on the voltage applied to the upper electrode 125 and the driving voltage applied to the first electrode 133. The organic light emitting diode (OLED) connected to the second electrode 135 of the driving transistor Qd emits light of which an intensity is differentiated depending on the output current of the driving transistor Qd, thereby displaying the image.

The gate line connected to the switching transistor Qs is non-overlapped with the bottom layer 70.

As above-described, since the bottom layer 70 is electrically connected to the second electrode 135 of the driving transistor Qd to be applied with the voltage, the range at which the current slope is small is widened in the saturation region among the voltage-current characteristic graph of the driving transistor Qd such that the deviation of the output current of the driving transistor Qd is reduced. Accordingly, even if the deviation is generated in the driving voltage transmitted through the driving voltage line 172, the luminance deviation of the organic light emitting diode (OLED) may be prevented, thereby increasing the display characteristic.

For example, if the bottom layer 70 includes the first layer 70a, the second layer 70b, and the third layer 70c as above-described, the oxidization and the corrosion of the second layer 70b by the buffer layer 111 may be prevented such that the resistance of the bottom layer 70 may be blocked from being increased. Accordingly, the voltage drop of the voltage transmitted by the bottom layer 70 and the second electrode 135 of the driving transistor Qd connected to the bottom layer 70 is blocked such that the luminance of the light emitted from the organic light emitting diode (OLED) is prevented from being decreased, thereby preventing the display characteristic deterioration of the transistor array panel.

The other characteristics and the effects according thereto of the above-described bottom layer 70 may also be equally applied to the present exemplary embodiment.

Next, the transistor array panel according to an exemplary embodiment of the present invention will be described with reference to FIG. 6 and FIG. 7 along FIG. 1 to FIG. 3.

The transistor array panel according to an present exemplary embodiment as a liquid crystal panel may include substantially the same constituent elements as the transistor array panel of FIG. 1 to FIG. 3. Here, an example including the same configuration as the transistor array panel according to the exemplary embodiment shown in FIG. 3 is described, however the structure of the liquid crystal panel according to an exemplary embodiment of the present invention is not limited thereto.

Figure 6:
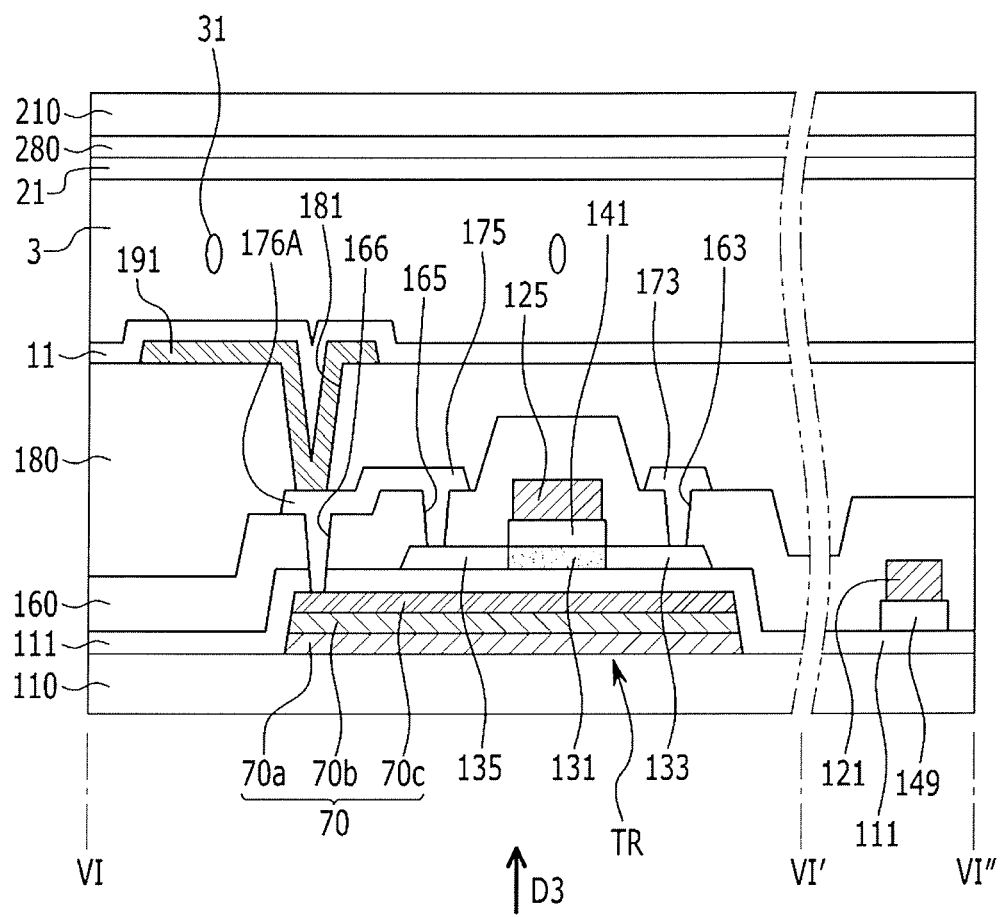
FIG. 6 is a cross-sectional view of a transistor array panel according to an exemplary embodiment of the present invention.
Figure 7:
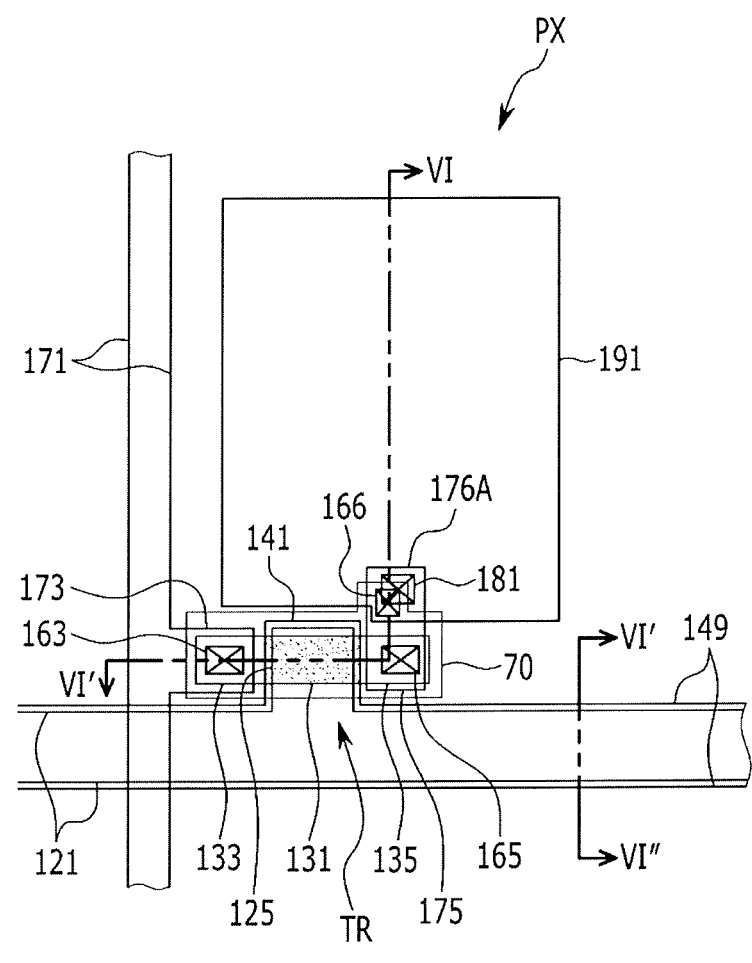
FIG. 7 is a top view of the transistor array panel shown in FIG. 6 according to an exemplary embodiment of the present invention.

FIG. 7 is a top plan view for one pixel PX of a transistor array panel according to an exemplary embodiment of the present invention, and FIG. 6 is the cross-sectional view of the transistor array panel shown in FIG. 7 taken along the line VI-VI'-VI", however the plane structure of the transistor array panel having the same cross-sectional structure as FIG. 6 is not limited to that shown in FIG. 7.

Referring to FIG. 6, a plurality of gate lines 121 connected to the upper electrode 125 of the above-described transistor TR is positioned on the substrate 110. The gate lines 121 and the upper electrode 125 may be formed of a same material. In an exemplary embodiment, the gate lines 121 and the upper electrode 125 may be formed using a same layer in a same process.

Referring to FIG. 7, the gate line 121 may mainly extend in the first direction D1. The upper electrode 125 may have a shape that is protruded upward from the gate line 121. The present invention is not limited thereto. For example, the upper electrode 125 may be downwardly protruded from the gate line 121.

The second gate insulator 149 positioned with the same layer and made of the same material as the first gate insulator 141 is positioned between the gate line 121 and the buffer layer 111. The second gate insulator 149 may have substantially the same shape as the overlying gate line 121. In an exemplary embodiment, the first gate insulator 141 is connected to the second gate insulator 149, and the entire plane shape of the sum of the first gate insulator 141 and the second gate insulator 149 may be substantially the same as the entire plane shape of the sum of the upper electrode 125 and the gate line 121.

The data conductor DS positioned on the interlayer insulating layer 160 may further include the data line 171 crossing the gate line 121. The data line 171 may be connected to the above-described first connection part 173. The data line 171 may mainly extend in the second direction D2. The first connection part 173 may have a shape that is protruded to the right from the data line 171. The present invention is not limited thereto. For example, the first connection part 173 may be protruded to the left from the data line.

A liquid crystal layer 3 including a plurality of liquid crystals 31 is positioned on the pixel electrode 191.

An insulating layer 210 encapsulating the liquid crystal layer 3 along with the substrate 110 may be positioned on the liquid crystal layer 3. The insulating layer 210 may have a substrate shape.

Referring to the cross-sectional structure shown in FIG. 6, an opposed electrode 280 generating an electric field to the liquid crystal layer 3 along with the pixel electrode 191 to control an arrangement direction of the liquid crystals 31 may be positioned under or on the insulating layer 210. In an exemplary embodiment, the opposed electrode 280 may be positioned between the substrate 110 and the liquid crystal layer 3.

Alignment layers 11 and 21 may be positioned between the liquid crystal layer 3 and the insulating layer 210 and between the liquid crystal layer 3 and the pixel electrode 191. The alignment layers 11 and 21 control initial alignment of the liquid crystals 31 when the electric field is not applied to the liquid crystal layer 3. The alignment layers 11 and 21 may be adjacent to the liquid crystal layer 3.

The display device including the transistor array panel according to an exemplary embodiment may be a light-receiving type of display device, and in this case, a backlight supplying the light to the transistor array panel may be further included. The backlight may be positioned under the substrate 110.

Next, the transistor array panel according to an exemplary embodiment of the present invention will be described with reference to FIG. 8 and FIG. 9.

Figure 8:
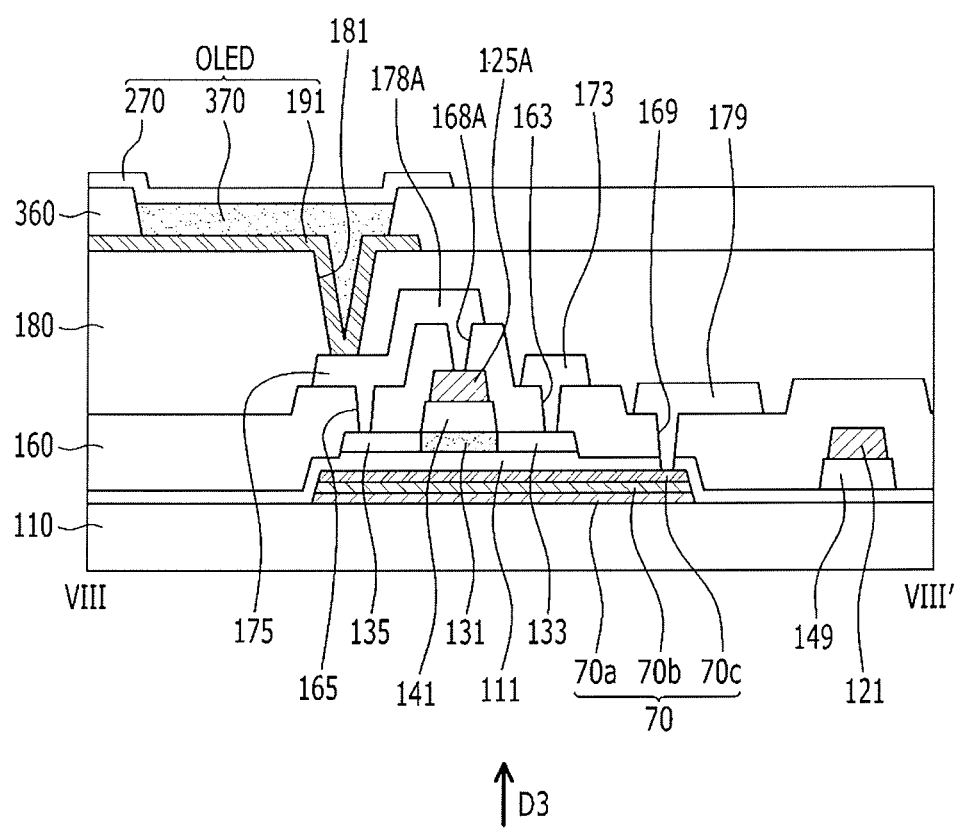
FIG. 8 is a cross-sectional view of a transistor array panel according to an exemplary embodiment of the present invention.
Figure 9:
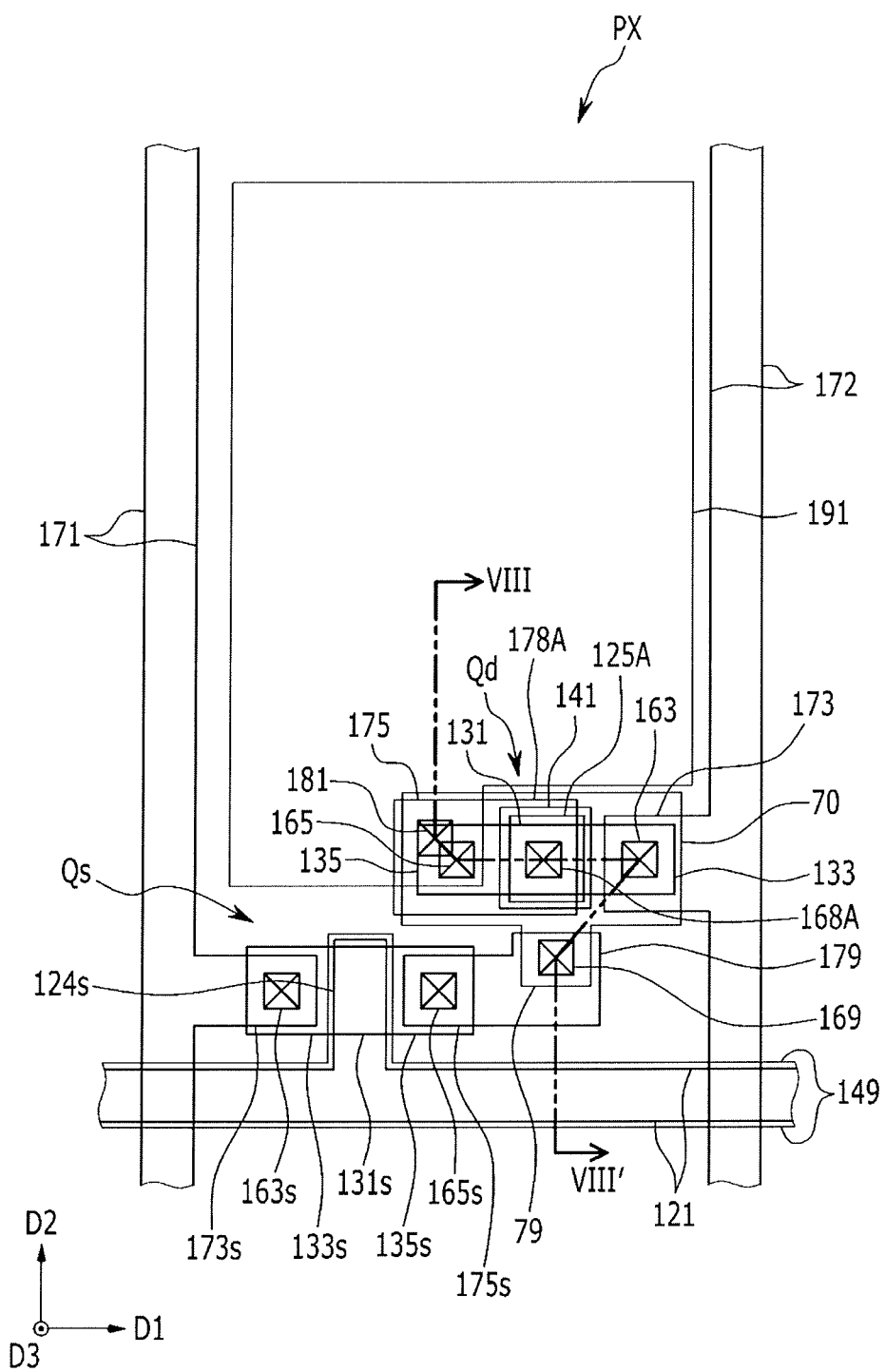
FIG. 9 is a top view of the transistor array panel shown in FIG. 8 according to an exemplary embodiment of the present invention.

FIG. 9 is a top plan view of one pixel PX of a transistor array panel according to an exemplary embodiment of the present invention, and FIG. 8 is a cross-sectional view of the transistor array panel shown in FIG. 7 taken along line VIII-VIII', however the plane structure of the transistor array panel having the same cross-sectional structure as FIG. 8 is not limited to that shown in FIG. 9.

The transistor array panel according to an exemplary embodiment is substantially the same as the organic light emitting panel shown in FIG. 4 and FIG. 5, however the structure of the driving transistor Qd and the data conductor, the shape of the bottom layer 70, and the contact hole included in the interlayer insulating layer 160 may be different.

Referring to FIG. 8 and FIG. 9, the bottom layer 70 may include a part overlapping the semiconductor layer 131, the first electrode 133, and the second electrode 135 of the driving transistor Qd and a protrusion 79 protruded therefrom. For example, the protrusion 79 may be protruded downwardly along the second direction from the part of the bottom layer 70 overlapping the semiconductor layer 131.

On the first gate insulator 141, an upper electrode 125A is positioned at the position corresponding to the upper electrode 125 of FIG. 4 and FIG. 5.

The interlayer insulating layer 160 and the buffer layer 111 may have a fifth contact hole 169 exposing the protrusion 79 of the bottom layer 70 and overlapping the protrusion 79 instead of the above-described third contact hole 166 of FIGS. 5 and 6, and the interlayer insulating layer 160 may have a sixth contact hole 168A exposing the upper electrode 125A and overlapping the upper electrode 125A.

The data conductor DC positioned on the interlayer insulating layer 160 may include a fifth connection part 179 in contact with the bottom layer 70 to be electrically connected through the fifth contact hole 169 and a sixth connection part 178A in contact with the upper electrode 125A to be electrically connected through the sixth contact hole 168A as well as above-described first connection part 173 and second connection part 175.

The fifth connection part 179 is connected to the switching drain electrode 175s. Accordingly, the bottom layer 70 is electrically connected to the switching drain electrode 175s of the switching transistor Qs, thereby receiving the voltage transmitted by the switching transistor Qs. Accordingly, in an exemplary embodiment, the bottom layer 70 functions as the gate electrode of the driving transistor Qd. [Note to client: No support from FIGS. 8 and 9].

The sixth connection part 178A is connected to the second connection part 175. Accordingly, the upper electrode 125A is electrically connected to the second source/drain region 135 of the driving transistor Qd, thereby being applied with the voltage transmitted by the second electrode 135 of the driving transistor Qd. As described above, if the voltage of the second electrode 135 of the driving transistor Qd is transmitted to the upper electrode 125A, the current slope decreases in the saturation region among the voltage-current characteristic graph of the driving transistor Qd such that an output saturation characteristic of the driving transistor Qd may be improved. [Note to client: No support from FIGS. 8 and 9, because 70 is not connected to 175 unlike FIGS. 4 and 5].

The present invention is not limited thereto. For example, the upper electrode 125A need not be electrically connected to the second electrode 135. In this case, a predetermined voltage may be applied to the upper electrode 125A or the upper electrode 125A may be floated.

Next, the transistor array panel according to an exemplary embodiment of the present invention will be described with reference to FIG. 10 and FIG. 11.

Figure 10:
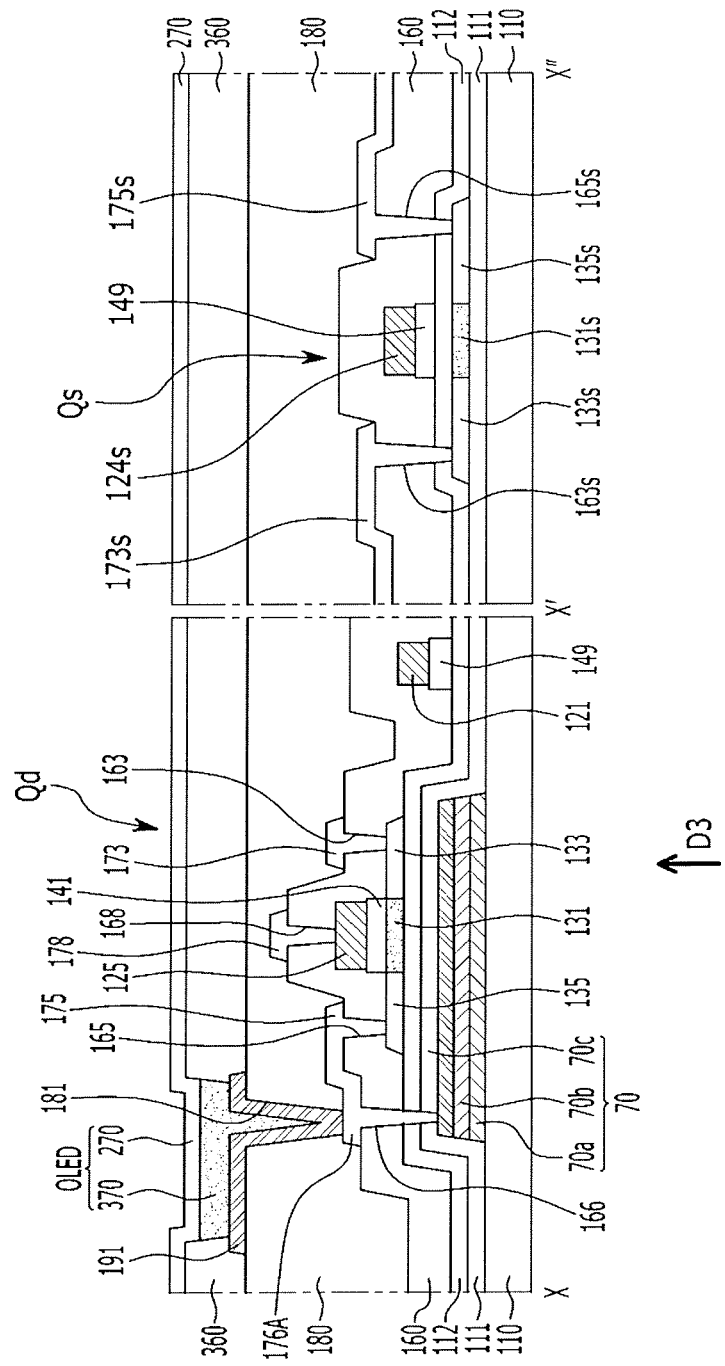
FIG. 10 is a cross-sectional view of a transistor array panel according to an exemplary embodiment of the present invention.
Figure 11:
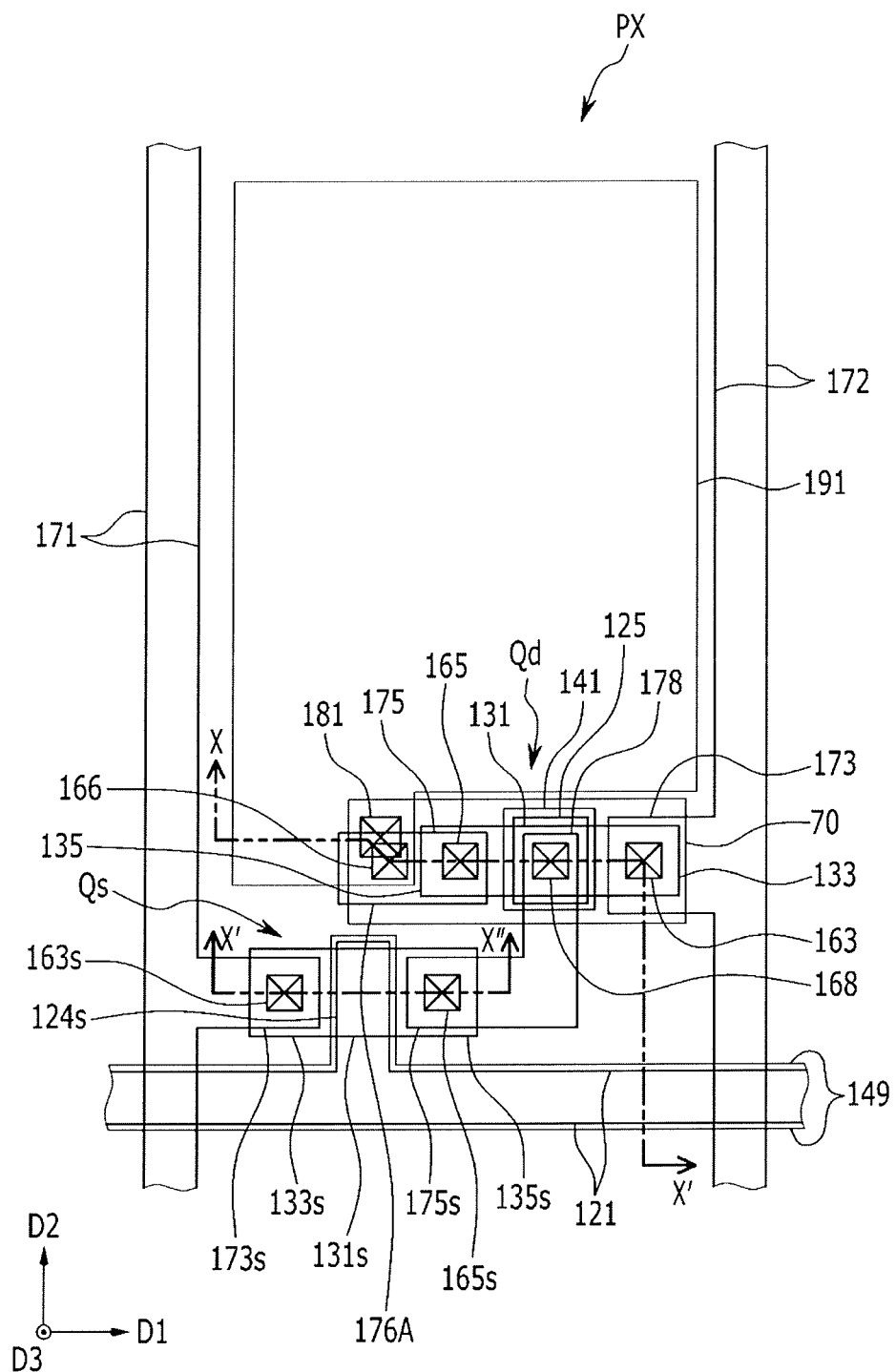
FIG. 11 is a top view of the transistor array panel shown in FIG. 10 according to an exemplary embodiment of the present invention.

FIG. 10 is a cross-sectional view of a transistor array panel according to an exemplary embodiment of the present invention, and FIG. 11 is a top view of one example of the transistor array panel shown in FIG. 10.

Referring to FIG. 10 and FIG. 11, the transistor array panel according to an exemplary embodiment is substantially the same as the transistor array panel of the above-described several exemplary embodiments such that differences will be mainly described.

Referring to FIG. 10, the bottom layer 70 is positioned on the substrate 110, the buffer layer 111 is positioned thereon, and a switching semiconductor member (131s, 133s, and 135s) including the switching semiconductor layer 131s, the first switching source/drain region 133s, and the second switching source/drain region 135s that are connected to each other may be positioned on the buffer layer 111.

An insulating layer 112 may be positioned on the switching semiconductor member (131s, 133s, and 135s) and the buffer layer 111. The insulating layer 112 may include an inorganic insulating material or an organic insulating material.

On the insulating layer 112, a driving semiconductor member (131, 133, and 135) including the first electrode 133, the second electrode 135, and the semiconductor 131 that are connected to each other may be positioned.

The upper electrode 125 may be positioned on the semiconductor layer 131 of the driving semiconductor member (131, 133, and 135) and the switching gate electrode 124s may be positioned on the switching semiconductor layer 131s of the switching semiconductor member (131s, 133s, and 135s). The switching gate electrode 124s and the upper electrode 125 may be positioned with the same layer and may include the same material. The present invention is not limited thereto.

The first gate insulator 141 may be positioned between the semiconductor layer 131 and the upper electrode 125, and the second gate insulator 149 may be positioned between the switching semiconductor layer 131s and the switching gate electrode 124s. For example, the second gate insulator 149 may be positioned between the insulating layer 112 and the switching gate electrode 124s. The second gate insulator 149 may be positioned with the same layer and may include the same material as the gate insulator 141, and as shown in FIG. 11, extends to be substantially parallel to the edge of the gate line 121 including the switching gate electrode 124s, thereby having substantially the same plane shape as the gate line 121.

The interlayer insulating layer 160 may be positioned on the switching gate electrode 124s and the upper electrode 125.

The interlayer insulating layer 160 may have the first contact hole 163 exposing the first electrode 133 and overlapping the first electrode 133, the second contact hole 165 exposing the second electrode 135 and overlapping the second electrode 135, and the contact hole 168 exposing the upper electrode 125 and overlapping the upper electrode 125. The interlayer insulating layer 160, the buffer layer 111, and the insulating layer 112 may have the third contact hole 166 exposing the bottom layer 70 and overlapping the bottom layer 70, and the interlayer insulating layer 160 and the insulating layer 112 may have the contact hole 163s exposing the first switching electrode 133s and overlapping the first switching electrode 133s and the contact hole 165s exposing the second switching electrode 135s and overlapping the second switching electrode 135s.

The switching semiconductor member (131s, 133s, and 135s) may be positioned with a different layer from the driving semiconductor member (131, 133, and 135) and the switching semiconductor member (131s, 133s and 135s) and the driving semiconductor member (131, 133 and 135) may include different semiconductor materials. For example, the switching semiconductor member (131s, 133s, and 135s) may include a polysilicon and the driving semiconductor member (131, 133, and 135) may include an oxide semiconductor, or vice versa. When the switching semiconductor member (131s, 133s, and 135s) includes the polysilicon, the first switching electrode 133s and the second switching electrode 135s may be doped with the n-type or p-type impurity to have conductivity, and when the driving semiconductor member (131, 133, and 135) includes the oxide semiconductor, the first electrode 133 and second electrode 135 may be doped with the n-type or p-type impurity to have conductivity.

In FIG. 10 and FIG. 11, the upper electrode 125 functioning as the gate electrode is positioned on the driving semiconductor member (131, 133, and 135), and the switching gate electrode 124s is positioned on the switching semiconductor member (131s, 133s, and 135s). The present invention is not limited thereto. For example, the upper electrode 125 may be positioned under the driving semiconductor member (131, 133, and 135), and the switching gate electrode 124s may be positioned under the switching semiconductor member (131s, 133s, and 135s).

While the present invention has been shown and described with reference to exemplary embodiments thereof, it will be apparent to those of ordinary skill in the art that various changes in form and detail may be made therein without departing from the spirit and scope of the inventive concept as defined by the following claims.

What is claimed is:

1. A transistor array panel comprising:
   a substrate;
   a transistor positioned on the substrate, the transistor including a semiconductor layer;
   a buffer layer positioned between the substrate and the semiconductor layer of the transistor and including an insulating material; and
   a bottom layer positioned between the substrate and the buffer layer, wherein the bottom layer and the semiconductor layer overlap each other, wherein the bottom layer includes a first layer and a second layer that are stacked in a direction away from the substrate, and wherein second layer is disposed between the buffer layer and the first layer and includes a first metal alloy including copper, nickel and zinc, wherein the first metal alloy includes the copper at about 40 atomic weight percent, the nickel at about 40 atomic weight percent and the zinc at about 20 atomic weight percent.

2. The transistor array panel of claim 1, wherein
the bottom layer further includes a third layer positioned between the first layer and the substrate, and
the third layer includes a second metal alloy including copper and nickel.

3. The transistor array panel of claim 2,
wherein the second metal alloy further includes zinc, and
wherein the second metal alloy includes the copper at about 40 atomic weight percent, the nickel at about 40 atomic weight percent and the zinc at about 20 atomic weight percent.

4. The transistor array panel of claim 3,
wherein the first layer includes copper.

5. The transistor array panel of claim 3,
wherein the insulating material of the buffer layer further includes hydrogen at a predetermined concentration.

6. The transistor array panel of claim 5,
wherein the insulating material of the buffer layer includes silicon oxide.

7. The transistor array panel of claim 3, wherein the transistor includes a first source or drain region, and a second source or drain region that are connected to the semiconductor layer, and wherein a gate electrode overlap the semiconductor layer,
wherein the second source or drain region and the bottom layer are electrically connected to each other.

8. The transistor array panel of claim 7, further comprising:
an interlayer insulating layer positioned on the transistor; and
a data conductor positioned on the interlayer insulating layer,
wherein the interlayer insulating layer has a first contact hole exposing the first source or drain region and a second contact hole exposing the second source or drain region,
wherein the interlayer insulating layer and the buffer layer has a third contact hole exposing the bottom layer, and
wherein the data conductor includes a first connection part connected to the first source or drain region through the first contact hole, a second connection part connected to the second source or drain region through the second contact hole, and a third connection part connected to the bottom layer through the third contact hole.

9. The transistor array panel of claim 8, wherein
the second connection part and the third connection part are connected to each other.

10. The transistor array panel of claim 9, further comprising:
a passivation layer positioned on the data conductor and having a fourth contact hole exposing, the third connection part; and
a pixel electrode positioned on the passivation layer and connected to the third connection part through the fourth contact hole.

11. The transistor array panel of claim 3,
wherein the transistor includes a first source or drain region and a second source or drain region that are connected to the semiconductor layer, and a gate electrode overlapping the semiconductor layer; and
wherein the second source or drain region and the gate electrode are electrically connected to each other.

12. The transistor array panel of claim 11, further comprising:
an interlayer insulating layer positioned on the transistor; and
a data conductor positioned on the interlayer insulating layer,
wherein the interlayer insulating layer has a first contact hole exposing the first source or drain region, a second contact hole exposing the second source or drain region, and a sixth contact hole exposing the gate electrode,
wherein the interlayer insulating layer and the buffer layer have a fifth contact hole exposing the bottom layer, and
wherein the data conductor includes a first connection part connected to the first source or drain region through the first contact hole, a second connection part connected to the second source or drain region through the second contact hole, a third connection part connected to the gate electrode through the sixth contact hole, and a fourth connection part connected to the bottom layer through the fifth contact hole.

13. The transistor array panel of claim 12,
wherein the second connection part and the third connection part are connected to each other.

14. A transistor array panel comprising:
a substrate;
a transistor positioned on the substrate and including a semiconductor layer;
a buffer layer positioned between the substrate and the transistor and including an insulating material; and
a bottom layer positioned between the substrate and the buffer layer and overlapping the semiconductor layer,
wherein the bottom layer includes a first layer including a metal and a second layer including a metal alloy including copper, nickel and zinc, wherein the metal alloy includes copper at about 40 atomic weight percent, the nickel at about 40 atomic weight percent and the zinc at about 20 atomic weight percent.

15. The transistor array panel of claim 14,
wherein the first layer includes copper.

16. The transistor array panel of claim 15,
wherein the insulating material of the buffer layer includes hydrogen at a predetermined concentration.

17. The transistor array panel of claim 16,
wherein the insulating material of the buffer layer includes silicon oxide.

18. A transistor array panel comprising:
a substrate;
a transistor positioned on the substrate and including a semiconductor layer;
a buffer layer positioned between the substrate and the transistor and including an insulating material; and
a bottom layer positioned between the substrate and the buffer layer and overlapping the semiconductor layer,
wherein the bottom layer includes a first layer including a metal and a second layer including a metal alloy including copper, nickel and zinc,
wherein the transistor includes a first source or drain region and a second source or drain region that are connected to the semiconductor layer, and a gate electrode overlapping the semiconductor layer, and wherein the second source or drain region and the bottom layer are electrically connected to each other.

19. The transistor array panel of claim 14,
wherein the transistor includes a first source or drain region and a second source or drain region that are connected to the semiconductor layer, and a gate electrode overlapping the semiconductor layer, and
wherein the second source or drain region and the gate electrode are electrically connected to each other.

20. A transistor array panel comprising:
a substrate including a first region and a second region;
a bottom layer positioned on the first region of the substrate, wherein the bottom layer includes a metal layer formed of a first metal and a metal alloy layer including the first metal;
a driving transistor positioned on the substrate, the driving transistor overlapping the bottom layer;
a switching transistor positioned on the second region of the substrate;
a pixel electrode electrically connected to a first source or drain region of the driving transistor; and
a gate line connected to a switching gate electrode of the switching transistor,
wherein a gate electrode of the driving transistor is electrically connected to a first source or drain region of the switching transistor,
wherein the gate line is positioned lower than the gate electrode of the driving transistor, and
wherein the bottom layer is electrically connected to the first source or drain region of the driving transistor and the pixel electrode.

21. The transistor array panel of claim 20,
wherein the first metal includes copper.

22. The transistor array panel of claim 21,
wherein the metal alloy layer further includes nickel and zinc.

23. The transistor array panel of claim 22,
wherein the metal alloy layer includes the copper at about 40 atomic weight percent, the nickel at about 40 atomic weight percent and the zinc at about 20 atomic weight percent.

24. The transistor array panel of claim 20,
wherein the gate electrode of the driving transistor is positioned higher than a portion of the gate line from the substrate.

25. The transistor array panel of claim 24,
wherein the portion of the gate line and the bottom layer are non-overlapped.

26. The transistor array panel of claim 20, further comprising:
a buffer layer positioned between the substrate and the driving transistor and between the substrate and the gate line connected to the switching transistor.

27. The transistor array panel of claim 20, further comprising:
a driving voltage line electrically connected to a second source or drain region of the driving transistor; and
a data line electrically connected to a second switching source or drain region of the switching transistor.

* * * * *